United States Patent
Waltari (10) Patent No.: US 8,928,513 B1
(45) Date of Patent: Jan. 6, 2015

(54) CURRENT STEERING DIGITAL-TO-ANALOG CONVERTER (DAC) SWITCH DRIVER

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/489,582

(22) Filed: Sep. 18, 2014

(51) Int. Cl.
*H03M 1/66* (2006.01)

(52) U.S. Cl.
CPC .................................... *H03M 1/66* (2013.01)
USPC ............................................ 341/144; 341/136

(58) Field of Classification Search
USPC ................. 341/144, 136; 327/99, 205
See application file for complete search history.

(56) References Cited

U.S. PATENT DOCUMENTS

| | | |
|---|---|---|
| 6,266,001 B1 | 7/2001 | Fang et al. |
| 6,310,569 B1 | 10/2001 | Chaudhry et al. |
| 6,768,438 B1 | 7/2004 | Schofield et al. |
| 6,927,714 B1 | 8/2005 | Teterwak |
| 6,967,609 B1 | 11/2005 | Bicakci et al. |
| 6,992,608 B2 | 1/2006 | Zhang et al. |
| 7,026,975 B1 * | 4/2006 | Steward et al. ............... 341/161 |
| 7,348,911 B2 | 3/2008 | Marais |
| 7,570,188 B2 | 8/2009 | Marais |
| 7,764,211 B2 | 7/2010 | Tokumaru et al. |
| 8,013,655 B2 * | 9/2011 | Herzer et al. ................. 327/333 |
| 8,120,404 B2 * | 2/2012 | Arora et al. ................... 327/202 |
| 8,441,382 B2 | 5/2013 | Mahajan et al. |
| 8,575,962 B2 * | 11/2013 | Yang et al. ..................... 326/80 |
| 8,816,889 B2 | 8/2014 | Teterwak |

* cited by examiner

*Primary Examiner* — Brian Young
(74) *Attorney, Agent, or Firm* — Law Office of Gerald Maliszewski; Gerald Maliszewski (57) ABSTRACT

A current steering digital-to-analog converter (DAC) switch driver circuit is provided. The circuit is composed of a conditioning module having a signal input to accept a binary logic digital signal, and signal outputs to supply differential driver signals V+ and V− with a low voltage level (Vlow) greater than the binary logic digital signal low voltage level. Typically, Vlow has a greater potential than ground (0V). A DAC current steering cell has a signal input to accept the differential driver signals and an output to supply a differential analog current responsive to the differential driver signals. The DAC current steering cell may be an NMOS DAC current steering cell. The conditioning module may be a CMOS switch driver, or composed of a level shifter followed by a CMOS switch driver.

21 Claims, 8 Drawing Sheets

Fig. 12

CURRENT STEERING DIGITAL-TO-ANALOG CONVERTER (DAC) SWITCH DRIVER

BACKGROUND OF THE INVENTION

1. Field of the Invention

This invention generally relates to digital-to-analog converters (DACs) and, more particularly, to a circuit using a CMOS switch driver that is particular useful for N metal-oxide-semiconductor (NMOS) current steering DACs.

2. Description of the Related Art

The dynamic performance of a high-speed current steering DAC is greatly influenced by the waveform of the differential control signals driving the current switch, generated using a switch driver circuit. Existing driver circuits can be divided in two main types: complementary MOS (CMOS) and current mode logic (CML).

Figure 1:
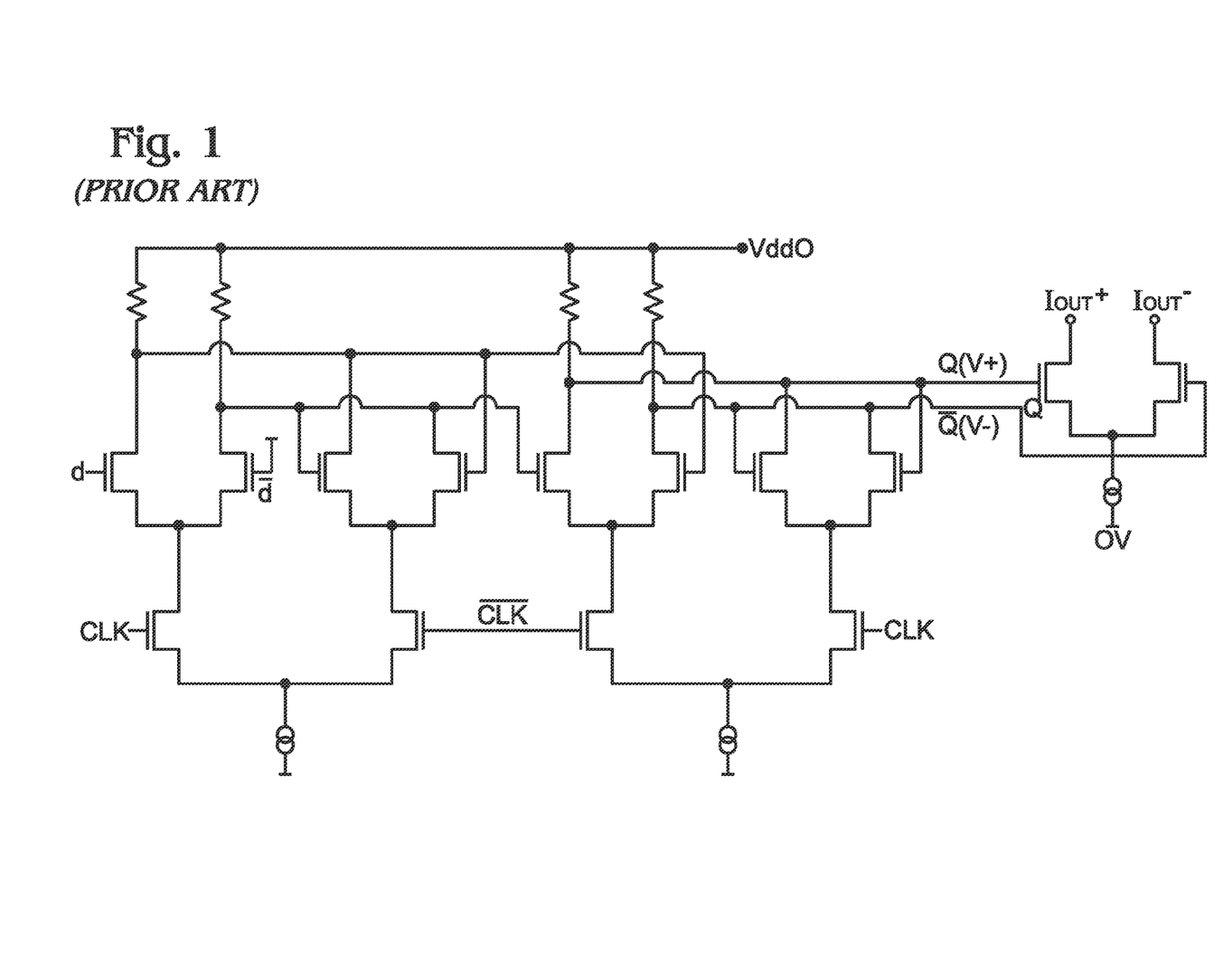
FIG. 1 is a diagram of NMOS current steering cell using a CML switch driver (prior art).

FIG. 1 is a diagram of NMOS current steering cell using a CML switch driver (prior art). A CMOS circuit has a voltage swing from the negative power supply (i.e. 0V) to the positive power supply (Vdd0). It is compact in area and consumes current only when the data (or clock) is changing. In contrast, the CML switch driver is based on the logic family with the same name. The output signals V− and V+ are differential and have a reduced voltage swing between some voltage Vlow and the positive power supply (Vdd0). The circuitry consists of always-on current sources, differential current switches, and load resistors. The positive power supply voltage to the CML switch driver may be Vdd0, or Vdd1 (Vdd1>Vdd0), where Vdd1 is the positive potential for the current steering cell. The result is very fast operation at the cost of significant current consumption and a relatively large area. By choosing a proper resistor value and magnitude of current, the amplitude of the output signal and its rise and fall times can be optimized for driving the DAC current steering cell. For good performance, output signals (V+ and V−) should change as simultaneously as possible. The simultaneity of timing between the multiple current cells in a DAC is also critical. A minimum clock to Q delay (delay from rising clock edge to change in the output) is also important to minimize the effects of clock jitter and component mismatch on timing.

The values of V+ and V− enable current flow through either path of the DAC current steering cell. The value of the DAC current steering cell differential output current is responsive to the binary digital value of d. Although not shown, properly scaled equivalent circuitry would exist for each bit of the digital word, with the output of each current steering DAC cell being combined to supply an analog current equivalent to the digital word. Typically, this current is converted to a voltage outside the DAC cell using resistors, or a combination of resistors and other passive components such as transformers, baluns, inductors, or capacitors (not shown).

In the case of an NMOS DAC current steering cell, Vdd1, which is the highest potential, is typically the high voltage to which the cell is connected. The negative supply voltage of the NMOS type DAC current steering cell can be considered to be 0V and is same potential as the main substrate.

Figure 2:
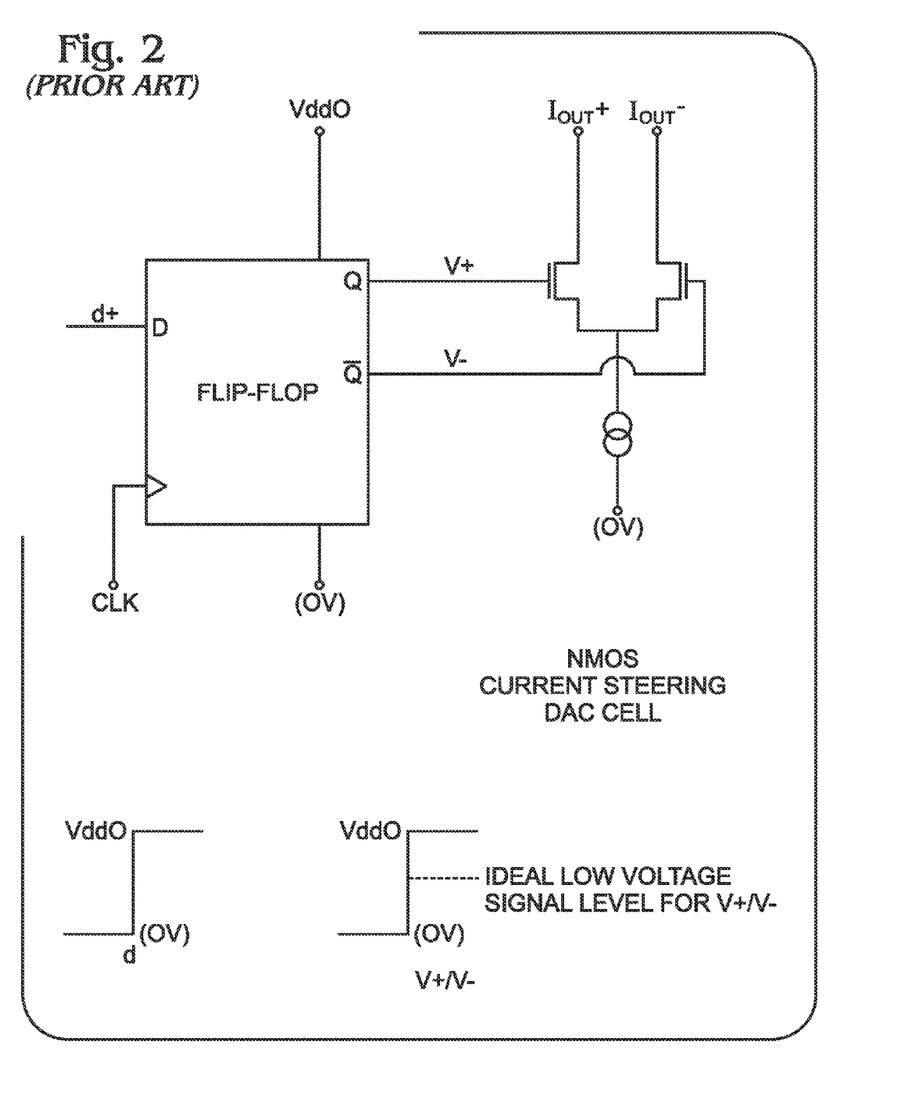
FIG. 2 is a diagram depicting an NMOS current steering DAC cell with an CMOS switch driver (prior art).

FIG. 2 is a diagram depicting an NMOS current steering DAC cell with a CMOS switch driver (prior art). CMOS type switch drivers have the advantages of CMOS circuits mentioned above. The driver can be implemented with thick oxide 10 devices allowing a large voltage swing at the cost of reduced rise and fall times and maximum switching speed. On the other hand, a CMOS driver implemented using thin oxide core devices is faster, but must operate with a lower voltage swing. The problem with the CMOS drivers is that the voltage levels (V+/V−) are not optimal for the DAC current steering cell. For a DAC with PMOS current sources and PMOS current switches, a core device CMOS switch driver is a reasonably good solution. A PMOS DAC current steering DAC can be operated efficiently with the V+/V− signal voltages between Vdd0 (Vdd0<Vdd1) and (0V).

But when NMOS current sources and switches are used, as is often desirable to take advantage of the inherently faster operation of the N-type devices, the voltage levels provided by a CMOS driver are not optimal. Alternatively stated, even if the high voltage supplied to the NMOS switch driver (D flip-flop) is less than Vdd1 (Vdd0<Vdd1), the V+/V− low voltage is still ground (0V). Thus, the voltage difference supplied to the DAC current steering cell (Vdd0 to (0V)) is larger than necessary to operate the NMOS current steering DAC cell efficiently. The high swing signals have two problems: the switch transistors must be thick oxide IO devices to be able to handle the large voltage, which is a severe speed penalty. Further, setting the low voltage level all the way to zero makes the transition longer and can cause unnecessary feedthrough to the output.

It would be advantageous if an NMOS DAC current steering still could be driven by a CMOS current switch driver supplying a low voltage switch signal greater than ground (0V).

SUMMARY OF THE INVENTION

Disclosed herein is a power and area efficient design for a switch driver circuit, used with a current steering digital-to-analog converter (DAC). The design is based on the understanding that in the modern process technology, the speed of a core device CMOS type switch driver is more than adequate for most high-speed DAC applications. Only if the voltage levels were more convenient, it could be used instead of a current mode logic (CML) switch driver to provide significant power and area benefits. The design described herein is able to takes advantage of the triple well manufacturing process, which permits electrically isolated regions of the silicon substrate, and uses a negative power supply voltage that is higher in potential than the conventional zero volts (ground) for the switch driver. The positive supply voltage is set to a desired amount above the negative supply voltage. With this freedom of having a 'floating' power supply for the switch driver, the level of the high value and the level of the low value of the driver output signal can be optimally set for the DAC current steering cell. Alternatively stated, the power supply of a circuit has two components—the negative supply voltage and the positive supply voltage, with the actual power supply voltage being the difference of those two. Conventionally, when the negative voltage is zero, the power supply voltage is the same as the positive supply voltage. Detaching the negative supply voltage from ground makes the power supply float. In this manner, A CMOS circuit can be used to supply the optimal voltage swing input to a DAC current steering cell, that must otherwise be provided by a CML switch driver.

In one aspect, a level shifting circuit, inserted between the digital input and the switch driver, translates the incoming digital data that uses conventional logic levels (e.g., Vdd0 and (0V), where Vdd0>(0V)) to the new voltage levels (e.g., Vhigh and Vlow, where Vhigh≥Vlow and Vlow>(0V)). While the use of additional supply voltages is less than ideal, the current draw from these supplies is relatively small, and they can be easily generated with on-chip voltage regulators that can be included in the DAC assembly.

Accordingly, a current steering DAC switch driver circuit is provided. The circuit is composed of a conditioning module having a signal input to accept a binary logic digital signal, and signal outputs to supply differential driver signals V+ and V− with a low voltage level (Vlow) greater than the binary logic digital signal low voltage level. Typically, Vlow has a greater potential than ground (0V). A DAC current steering cell has a signal input to accept the differential driver signals and an output to supply a differential analog current responsive to the differential driver signals. The DAC current steering cell may be a DAC NMOS current steering cell, for example.

In one aspect, the conditioning module is a complementary metal oxide semiconductor field effect transistor (CMOS) switch driver having inputs to accept a first power supply voltage (Vhigh) equal to the binary logic digital signal high voltage level and a lower second power supply voltage equal to (Vlow). Alternatively, the conditioning module may be composed of a level shifter having an input to accept a first binary logic digital signal and an output to supply a second binary logic digital signal in response to the first binary logic digital signal. The second binary logic digital signal has a low voltage level equal to (Vlow). A CMOS switch driver has an input to accept the second binary logic digital signal and an output to supply the differential driver signals in response to the second binary logic digital signal.

For example, the level shifter may have inputs to accept a third power supply voltage (Vdd0) equal to the first binary digital signal high voltage level and a lower fourth power supply voltage (0V) equal to the first binary digital signal low voltage level. The level shifter then has inputs to accept a first power supply voltage (Vhigh) equal to the second binary digital signal high voltage level and a lower second power supply voltage equal to (Vlow). In that case, the CMOS switch driver has inputs to accept the first and second power supply voltages, and the DAC current steering cell is an NMOS DAC current steering cell having an input to accept the fourth power supply voltage (0 V).

Additional details of the above described DAC current steering switch driver circuit are provided below.

DETAILED DESCRIPTION

Figure 3:
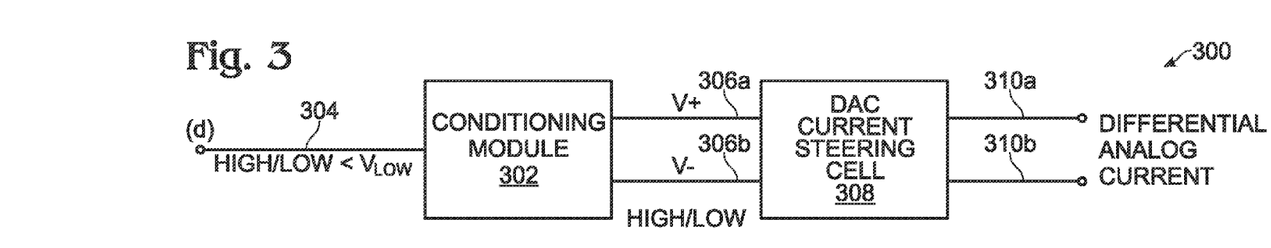
FIG. 3 is a schematic block diagram depicting a current steering digital-to-analog converter (DAC) switch driver circuit.

FIG. 3 is a schematic block diagram depicting a current steering digital-to-analog converter (DAC) switch driver circuit. The circuit 300 comprises a conditioning module 302 having a signal input on line 304 to accept a binary logic digital signal (d), and signal outputs on lines 306a and 306b to respectively supply differential driver signals V+ and V− with a low voltage level (Vlow) greater than the binary logic digital signal low voltage level. In one aspect, Vlow is higher in potential than ground (0V). A DAC current steering cell 308 has a signal input to accept the differential driver signals on lines 306a and 306b and an output on lines 310a and 310b to supply a differential analog current (Iout+ and Iout−) responsive to the differential driver signals.

Figure 4:
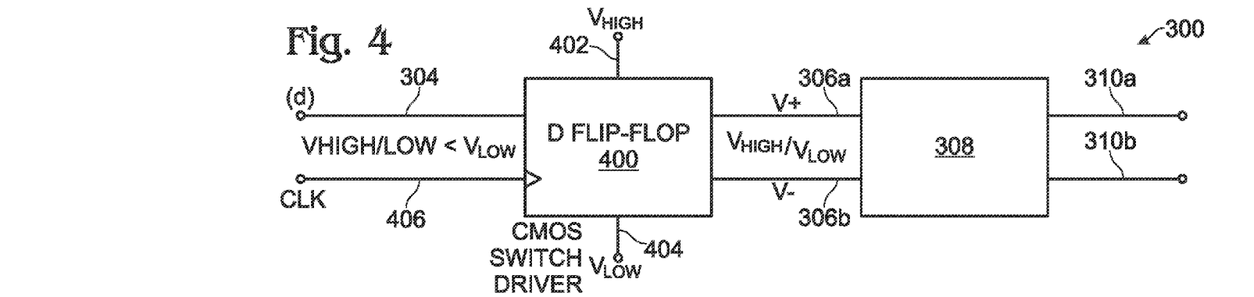
FIG. 4 is a schematic block diagram depicting a first variation of the circuit of FIG. 3.

FIG. 4 is a schematic block diagram depicting a first variation of the circuit of FIG. 3. In this aspect, the conditioning module is a complementary metal oxide semiconductor field effect transistor (CMOS) switch driver 400 having an input on line 402 to accept a first power supply voltage (Vhigh) equal to the binary logic digital signal high voltage level and a lower second power supply voltage on line 404 equal to (Vlow). In this aspect, the CMOS switch driver 400 is enabled using a clocked single-ended input differential output D flip-flop, accepting the single-ended input binary digital signal on line 302 and clock signal (CLK) on line 406. However, a variety of other CMOS circuits capable of acting as a switch driver would be known by one with skill in the art.

Figure 5:
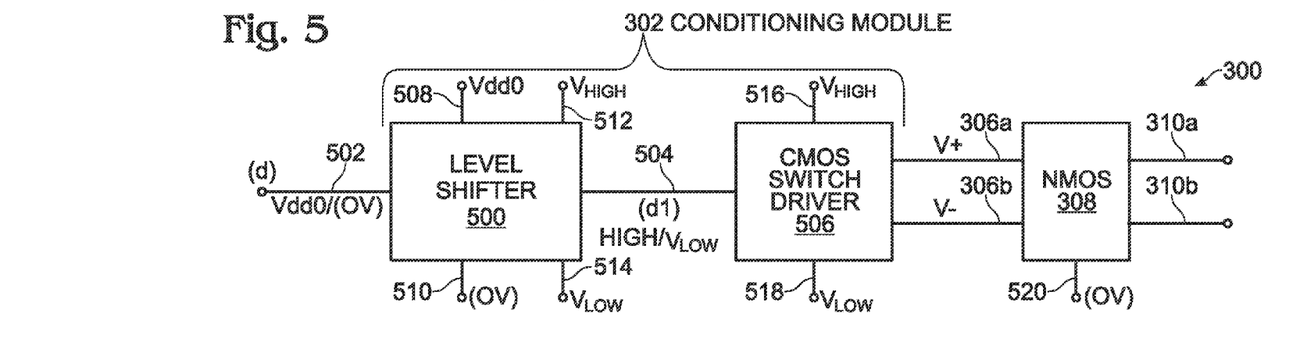
FIG. 5 is a schematic block diagram depicting a second variation of the circuit of FIG. 3.

FIG. 5 is a schematic block diagram depicting a second variation of the circuit of FIG. 3. In this aspect, the conditioning module 302 comprises a level shifter 500 having an input on line 502 to accept a first binary logic digital signal (d) and an output on line 504 to supply a second binary logic digital signal (d1) in response to the first binary logic digital signal. The second binary logic digital signal on line 504 has a low voltage level equal to (Vlow). A CMOS switch driver 506 has an input on line 504 to accept the second binary logic digital signal and an output on lines 306a and 306b to supply the differential driver signals in response to the second binary logic digital signal. As above, the CMOS switch driver may be enabled as a D flip-flop.

In one aspect, the level shifter 500 has an input on line 508 to accept a third power supply voltage (Vdd0) equal to the first binary digital signal high voltage level and a lower fourth power supply voltage (0V) on line 510 equal to the first binary digital signal low voltage level. The level shifter 500 has an input on line 512 to accept a first power supply voltage (Vhigh) equal to the second binary digital signal high voltage level and an input to accept a lower second power supply voltage on line 514 equal to (Vlow). In this case, the "high" signal voltage level associated with the second binary digital signal on line 504 is equal to Vhigh.

Likewise, the CMOS switch driver 506 has an input on line 516 to accept the first power supply voltage (Vhigh) and an input on line 518 to accept the second power supply voltage (Vlow). In this case, the DAC current steering cell may be an NMOS DAC current steering cell having an input to accept the fourth power supply voltage (0V).

Figure 6:
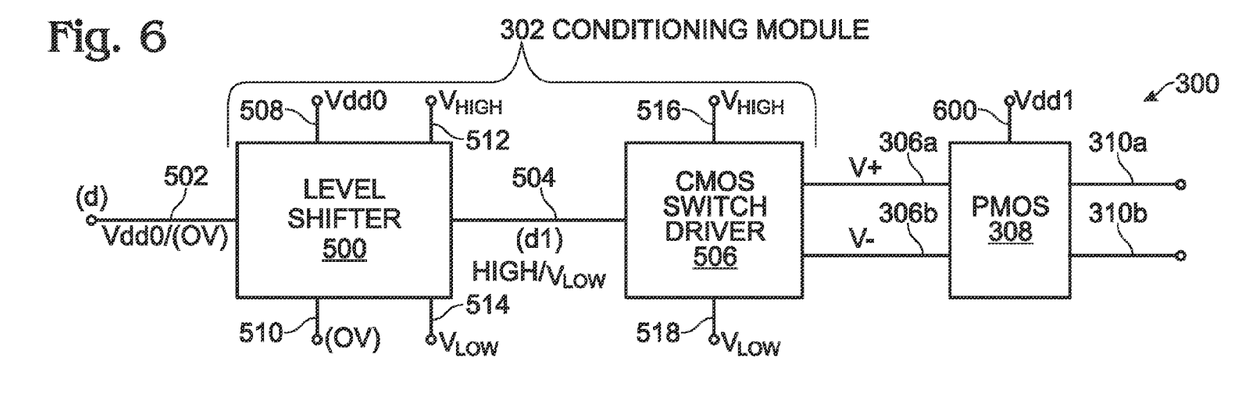
FIG. 6 is a schematic block diagram depicting a third variation of the circuit of FIG. 3.

FIG. 6 is a schematic block diagram depicting a third variation of the circuit of FIG. 3. In this aspect, the conditioning module 302 comprises a level shifter 500 having an input on line 502 to accept a first binary logic digital signal (d) and an output on line 504 to supply a second binary logic digital signal (d1) in response to the first binary logic digital signal. The second binary logic digital signal on line 504 has a low voltage level equal to (Vlow). A CMOS switch driver 506 has an input on line 504 to accept the second binary logic digital signal and an output on lines 306a and 306b to supply the differential driver signals in response to the second binary logic digital signal. As above, the CMOS switch driver may be enabled as a D flip-flop.

In one aspect, the level shifter 500 has an input on line 508 to accept a third power supply voltage (Vdd0) equal to the first binary digital signal high voltage level and a lower fourth power supply voltage (0V) on line 510 equal to the first binary digital signal low voltage level. The level shifter 500 has an input on line 512 to accept a first power supply voltage (Vhigh) equal to the second binary digital signal high voltage level and an input to accept a lower second power supply voltage on line 514 equal to (Vlow). In this case, the "high" signal voltage level associated with the second binary digital signal on line 504 is equal to Vhigh.

Likewise, the CMOS switch driver 506 has an input on line 516 to accept the first power supply voltage (Vhigh) and an input on line 518 to accept the second power supply voltage (Vlow). In this case, the DAC current steering cell 308 is a DAC PMOS current steering cell having an input on line 600 to accept a fifth power supply voltage (Vdd1) greater than or equal to the third power supply voltage (Vdd0). As another alternative not shown, lines 514 and 518 may be connected to the fourth power supply (0V), so that the voltage swing between V+ and V− is between Vhigh and (0V).

Figure 7:
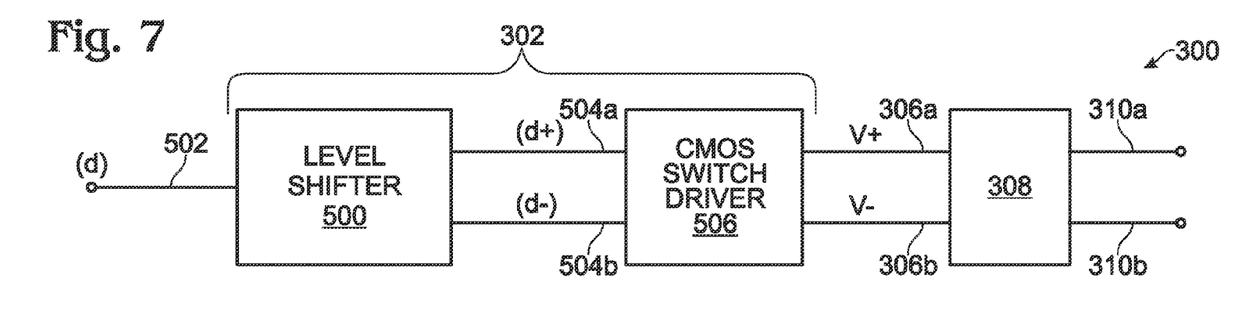
FIG. 7 is a schematic block diagram depicting a fourth variation of the circuit of FIG. 3.

FIG. 7 is a schematic block diagram depicting a fourth variation of the circuit of FIG. 3. In this aspect, the first binary logic digital signal on line 502 is a single-ended signal, and the second binary logic digital signal supplied by the level shifter 500 is a differential signal on lines 504a (d+) and 504b (complement d−).

Figure 8:
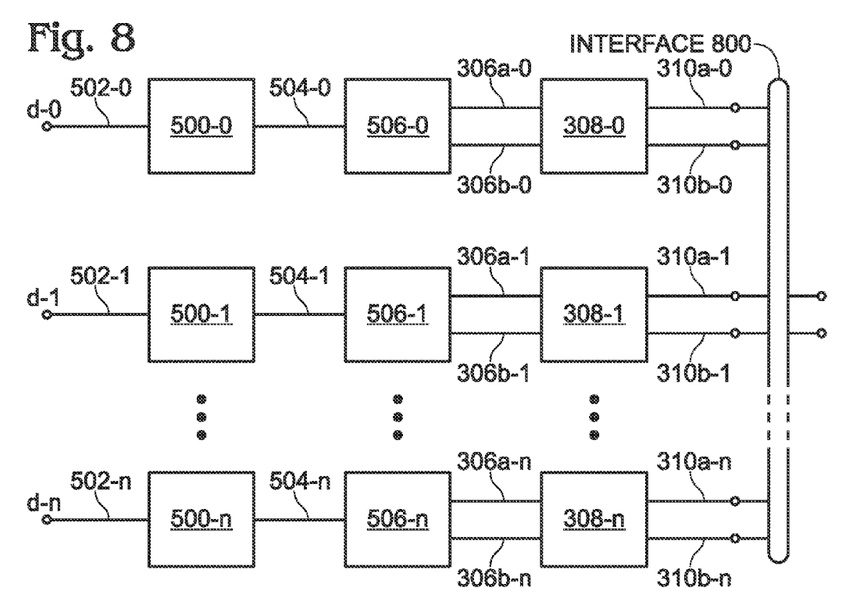
FIG. 8 is a schematic block diagram depicting a plurality of the DAC current steering cells of FIG. 5 or 6.

FIG. 8 is a schematic block diagram depicting a plurality of the DAC current steering cells of FIG. 5 or 6. Shown are a plurality of n level shifters 500-0 through 500-n, where n is an integer greater than 1. Each level shifter accepts a corresponding bit from an n-bit digital word. A plurality of n CMOS switch drivers 506-0 through 506-n are shown. Each CMOS switch driver 506-0 through 506-n has a signal input connected to a corresponding level shifter signal output, respectively, 504-0 through 504-n. A plurality of n DAC current steering cells 308-0 through 308-n are shown. Each DAC current steering cell has a signal input connected to a corresponding CMOS switch driver differential signal output. The DAC current steering cells have outputs on lines 310a-0 through 310b-n to supply differential analog current from each of the n DAC current steering cells via interface 800 to a current summing circuit (not shown) that sums of the differential analog currents.

Figure 9:
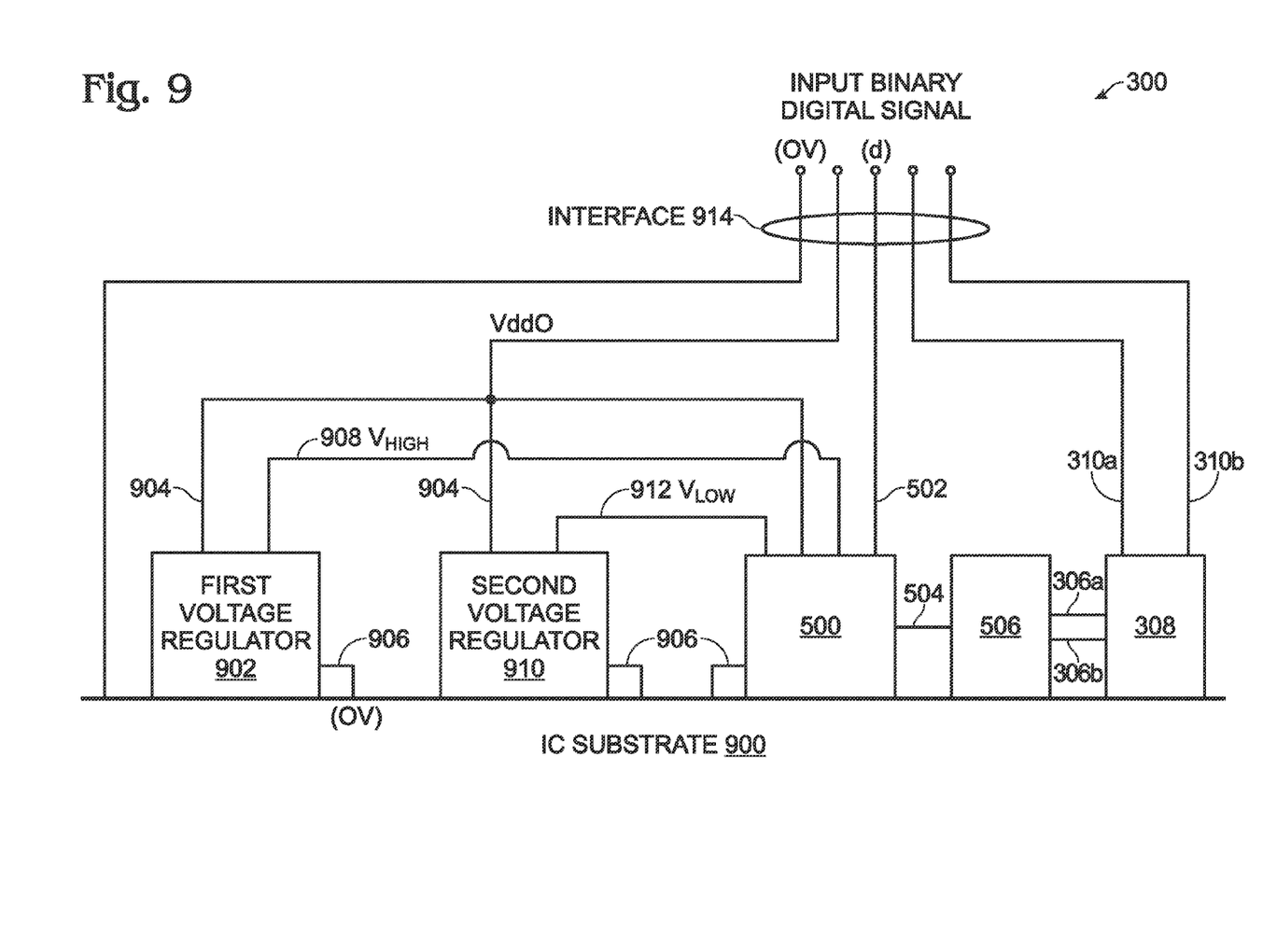
FIG. 9 is a partial cross-sectional schematic view depicting a fifth variation of the circuit of FIG. 3.

FIG. 9 is a partial cross-sectional schematic view depicting a fifth variation of the circuit of FIG. 3. Shown is an integrated circuit (IC) substrate 900. A first voltage regulator 902 has inputs to accept a fifth power supply voltage (Vdd0) on line 904 and, on line 906, the fourth power supply voltage (0V) less than Vlow. Here, line 906 is shown connected to the substrate 900, which may be a doped semiconductor (e.g. p-type) such as silicon. The first voltage regulator 902 has an output on line 908 to supply the first power supply voltage (Vhigh). A second voltage regulator 910 has inputs on lines 910 and 912 to respectively accept the fourth and fifth power supply voltages on lines 906 and 904. The second voltage regulator 910 has an output on line 912 to supply the second power supply voltage (Vlow). The Vhigh power supply voltage on line 908, the Vlow power supply voltage on line 912, the Vdd0 power supply voltage on line 904, and the (0V) power supply voltage on line 906 are shown connected to the level shifter 500 as in FIG. 5. As in other aspects of the circuit, Vhigh and Vlow may also be connected to the CMOS switch driver 506. The first voltage regulator 902, second voltage regulator 910, level shifter 500, CMOS switch driver 506, and DAC current steering cell 308 are formed on the IC substrate 900. Typically, the Vdd0 and (0V) power supply voltages and the input binary digital signal are supplied via interface 914, which also accepts the differential analog currents on lines 310a and 310b for delivery to a current summing circuit (not shown).

Figure 10:
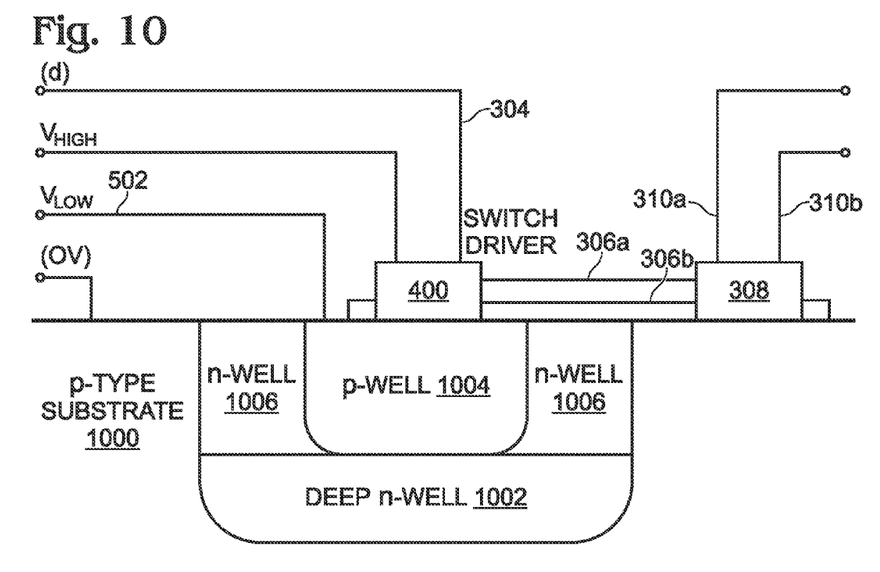
FIG. 10 is a partial cross-sectional schematic depicting a first variation of the circuit of FIG. 4.

FIG. 10 is a partial cross-sectional schematic depicting a first variation of the circuit of FIG. 4. An integrated circuit (IC) p-type substrate 1000 has a deep n-well 1002 and a p-well 1004 isolated from the p-type 1000 substrate by the deep n-well 1002, which underlies the p-well, and n-wells 1006 surrounding the p-well as sidewalls. Virtually all silicon integrated circuits are made on p-type silicon wafers. The substrate is connected to 0V and outside the chip to the ground plane of the printed circuit board (PCB) on which it is fabricated, or to which it interfaces. Normally, all NMOS devices are built directly on the substrate, which means that their bulk terminal is connected to the substrate. This also means that the negative supply voltage (i.e. ground) of those circuits has to be 0V. Optionally, the substrate can be made with an additional processing step to build a deep n-well layer (as shown), which can be used to create isolated p-type regions on the substrate (p-wells). As these p-wells are electrically isolated (by the means of a reverse biased pn-junction) from the rest of the substrate, the negative power supply and the bulk terminal of the NMOS devices on those regions doesn't have to be at 0V. Rather, it can be a higher potential voltage, such as Vlow. The use of an isolated p-well also provides better noise immunity against noisy digital circuits that might be located elsewhere on the p-type substrate.

In the case of an NMOS DAC current steering cell, Vdd1, which is the highest potential, is typically the voltage to which the load resistors (or inductors) are connected. The load is often placed off the substrate on a PCB that interfaces with the DAC. The negative supply voltage of the NMOS DAC current steering cell is 0V and the same potential as the p-type substrate.

Typically, power supply voltages Vdd1 and Vdd0 are also provided by the interfacing PCB. Vdd1 is the input/output (IO) supply voltage, typically in the range from 1.8V to 3.3V. Vdd0 is the low voltage supply (used for all the digital logic) which is typically in the range from 0.7V to 1.2V. In this case Vhigh=Vdd1 and Vlow is generated with a regulator.

Vdd0 is a positive power supply for circuits using core device thin oxide MOSFETS that make up the bulk of the ICs today. These devices cannot tolerate higher power supply voltages (i.e. Vdd1) without being permanently damaged. The digital signal input to the level shifter uses this voltage as the high logic level.

Vdd1 is a positive power supply for circuits using thick oxide IO devices. These transistors have a thicker gate oxide and longer channel length, and are used in digital IO circuitry and some of the analog functions. The high voltage tolerance is significantly better than with thin oxide devices. Circuits following the DAC current steering cell typically use this voltage as its power supply.

Vlow is the negative power supply for the CMOS switch driver. This voltage is higher than 0V, which is unconventional and requires a triple well manufacturing process. This voltage is the low logic level of the input and output signals of the driver. The same symbol is also used for the low logic level of the prior art CML signal. This voltage is not tied to Vdd0, and can be higher, lower, or the same as Vdd0. For example, Vlow may be about 1.0V.

Vhigh is the positive power supply for the CMOS switch driver. This voltage is also the logic high level for the driver input and output signals. This voltage is higher than Vlow, and lower or equal to Vdd1. It has no direct relationship with Vdd0. For example, Vhigh may be about 2.0 V.

A voltage regulator, not shown, which may be fabricated on the p-type substrate or on an external PCB, may supply the second power supply voltage (Vlow) connected to the p-well 1004. In this aspect, the CMOS switch driver 400 uses the Vhigh power supply voltage on line 1008. If the DAC current cell 308 is an NMOS DAC current cell, it is connected to the p-type substrate 1000 (0V), as shown. In the case of a PMOS DAC current steering cell and PMOS switch driver, these circuits may be fabricated on the n-well, with the n-well being connected to the positive supply voltage of that particular circuit.

Figure 11:
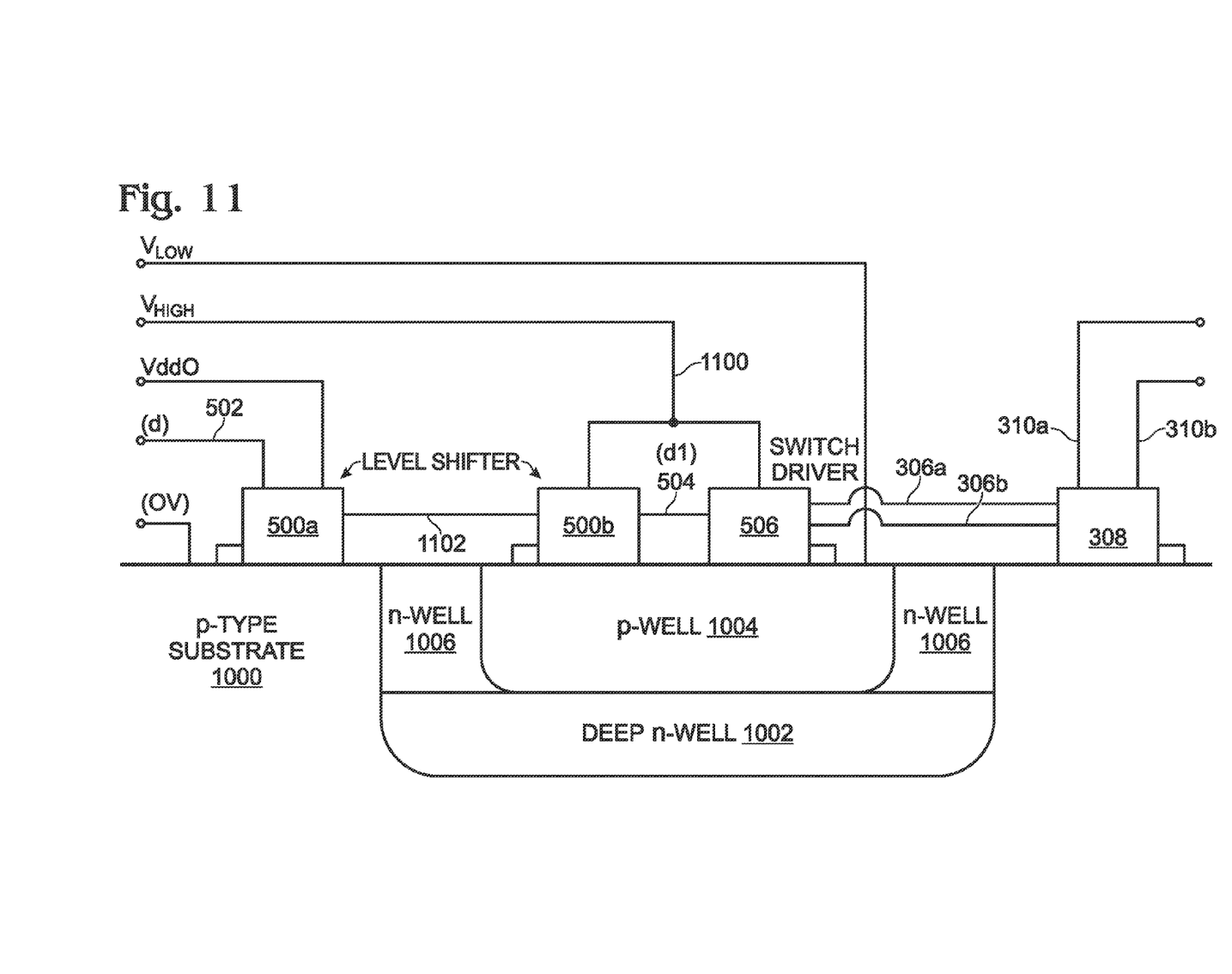
FIG. 11 is a partial cross-sectional schematic depicting a second variation of the circuit of FIG. 5 or 6.

FIG. 11 is a partial cross-sectional schematic depicting a second variation of the circuit of FIG. 5 or 6. An IC p-type substrate 1000 has a deep n-well 1002 and a p-well 1004 isolated from the p-type 1000 substrate by the deep n-well 1002, which underlies the p-well, and n-wells 1006 surrounding the p-well as sidewalls. A voltage regulator, not shown, which may be fabricated on the p-type substrate or on an external PCB, may supply the second power supply voltage (Vlow) connected to the p-well 1004. In this aspect, the CMOS switch driver 506 uses the Vhigh power supply voltage on line 1100, which is less than Vdd0 (or Vdd1). Here the level shifter is shown divided into two components, component 500a on p-type substrate 1000 (i.e. connected to (0V)) and component 506b (i.e. connected to Vlow). A binary logic digital signal related to (d) is passed from component 500a to component 500b on line 1102. If the DAC current cell 308 is an NMOS DAC current cell, it is connected to the p-type substrate 1000 (0V), as shown.

Figure 12:
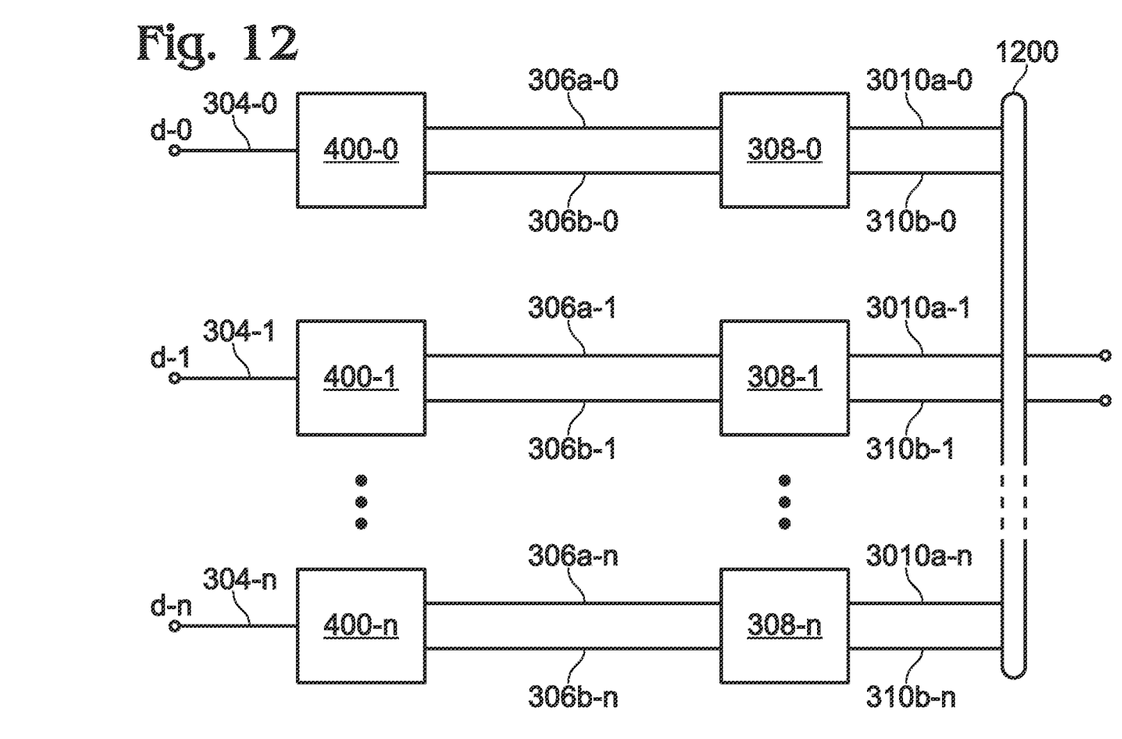
FIG. 12 is a schematic block diagram depicting a plurality of the DAC current steering cells of FIG. 4.

FIG. 12 is a schematic block diagram depicting a plurality of the DAC current steering cells of FIG. 4. A plurality of n CMOS switch drivers 400-0 through 400-n are shown, where n is an integer greater than 1. Each CMOS switch driver accepts a corresponding bit from an n-bit digital word on lines 304-0 through 304-n. A plurality of n DAC current steering cells 308-0 through 308-n are shown. Each DAC current steering cell has a signal input connected to a corresponding CMOS switch driver differential signal output. The DAC current steering cells output differential analog currents on lines 310a-0 through 310b-n to a current summing circuit (not shown) via interface 1200.

In summary, a circuit comprising of a level shifter, CMOS type switch driver circuit with 'floating' power supply (Vlow), and a DAC current steering cell are provided. The use of the floating power supply has particular relevance to MOS type current steering cells. The use of an isolated p-well and voltage regulator(s) provide one or both of the voltages Vlow and Vhigh, and are integrated in the same silicon die as the DAC.

A current steering DAC switch driver circuit has been provided. Examples of particular device layouts and voltage levels have been presented to illustrate the invention. However, the invention is not limited to merely these examples. Simplified examples of switch drivers and DAC current steering cells have also been presented, and it should be understood that the use of a CMOS switch driver with a floating negative voltage (Vlow) is applicable to a multiple of different types of these circuits. Other variations and embodiments of the invention will occur to those skilled in the art.

I claim:

1. A current steering digital-to-analog converter (DAC) switch driver circuit comprising:
a conditioning module having a signal input to accept a binary logic digital signal, and signal outputs to supply differential driver signals V+ and V− with a low voltage level (Vlow) greater than the binary logic digital signal low voltage level;
a DAC current steering cell having a signal input to accept the differential driver signals and an output to supply a differential analog current responsive to the differential driver signals; and,
wherein the conditioning module is a complementary metal oxide semiconductor field effect transistor (CMOS) switch driver having inputs to accept a first power supply voltage (Vhigh) equal to the binary logic digital signal high voltage level and a lower second power supply voltage equal to (Vlow).

2. A current steering digital-to-analog converter (DAC) switch driver circuit comprising:
a conditioning module having a signal input to accept a binary logic digital signal, and signal outputs to supply differential driver signals V+ and V− with a low voltage level (Vlow) greater than the binary logic digital signal low voltage level;
a DAC current steering cell having a signal input to accept the differential driver signals and an output to supply a differential analog current responsive to the differential driver signals;
wherein the conditioning module comprises:
a level shifter having an input to accept a first binary logic digital signal and an output to supply a second binary logic digital signal in response to the first binary logic digital signal, where the second binary logic digital signal has a low voltage level equal to (Vlow); and,
a CMOS switch driver having an input to accept the second binary logic digital signal and an output to supply the differential driver signals in response to the second binary logic digital signal.

3. The circuit of claim 2 wherein the level shifter has inputs to accept a third power supply voltage (Vdd0) equal to the first binary digital signal high voltage level and a lower fourth power supply voltage (0V) equal to the first binary digital signal low voltage level, and inputs to accept a first power supply voltage (Vhigh) equal to the second binary digital signal high voltage level and a lower second power supply voltage equal to (Vlow).

4. The circuit of claim 3 wherein the CMOS switch driver has inputs to accept the first and second power supply voltages; and,
wherein the DAC current steering cell is an NMOS DAC current steering cell having an input to accept the fourth power supply voltage (0V).

5. The circuit of claim 3 wherein the CMOS switch driver has inputs to accept the first and second power supply voltages; and,
wherein the DAC current steering cell is a PMOS DAC current steering cell having an input to accept a fifth power supply voltage (Vdd1) greater than or equal to the third power supply voltage (Vdd0).

6. The circuit of claim 2 wherein the first binary logic digital signal is a single-ended signal, and wherein the second binary logic digital signal is a differential signal.

7. The circuit of claim 2 further comprising:
a plurality of n level shifters, where n is an integer greater than 1, each level shifter accepting a corresponding bit from an n-bit digital word;
a plurality of n CMOS switch drivers, each CMOS switch driver having a signal input connected to a corresponding level shifter signal output; and,
a plurality of n DAC current steering cells, each DAC current steering cell having a signal input connected to a corresponding CMOS switch driver differential signal output and an output to supply a differential analog current.

8. The circuit of claim 3 further comprising:
an integrated circuit (IC) substrate;
a first voltage regulator having an inputs to accept a fifth power supply voltage (Vdd0) and the fourth power supply voltage (0V) less than Vlow, and an output to supply the first power supply voltage (Vhigh);
a second voltage regulator having inputs to accept the fourth and fifth power supply voltages, and an output to supply the second power supply voltage (Vlow); and,
wherein the first voltage regulator, second voltage regulator, level shifter, CMOS switch driver, and DAC current steering cell are formed on the IC substrate.

9. The circuit of claim 1 further comprising:
an integrated circuit (IC) p-type substrate with a deep n-well, and a p-well isolated from the p-type substrate by the deep n-well and n-well sidewalls; and,
wherein the CMOS switch driver is fabricated on the p-well.

10. The circuit of claim 2 further comprising:
an IC p-type substrate with a deep n-well, and a p-well isolated from the p-type substrate by the deep n-well and n-well sidewalls;
wherein the CMOS switch driver is fabricated on the p-well; and,
wherein the level shifter is at least partially fabricated on the p-well.

11. The circuit of claim 1 further comprising:
a plurality of n CMOS switch drivers, where n is an integer greater than 1, each CMOS switch driver having a signal input connected to accept a corresponding bit from an n-bit digital word; and,
a plurality of n DAC current steering cells, each current steering cell having a signal input connected to a corresponding CMOS switch driver differential signal output and an output to supply a differential analog current.

12. The circuit of claim 1 wherein the DAC current steering cell is an NMOS DAC current steering cell.

13. The circuit of claim 1 wherein (Vlow) is greater than ground (0V).

14. A current steering digital-to-analog converter (DAC) switch driver circuit comprising:
a complementary metal oxide semiconductor field effect transistor (CMOS) switch driver having a signal input to accept a binary logic digital signal, inputs to accept a first power supply voltage (Vhigh) equal to the binary logic digital signal high voltage level and a lower second power supply voltage equal to (Vlow), and signal outputs to supply differential driver signals V+ and V− with a low voltage level (Vlow) greater than the binary logic digital signal low voltage level; and,
an NMOS DAC current steering cell having a signal input to accept the differential driver signals, and input connected to a power supply with a voltage equal to (0V), where Vlow>(0V), and an output to supply a differential analog current responsive to the differential driver signals.

15. The circuit of claim 14 further comprising:
a plurality of n CMOS switch drivers, where n is an integer greater than 1, each CMOS switch driver accepting a corresponding bit from an n-bit digital word;
a plurality of n NMOS DAC current steering cells, each NMOS DAC current steering cell having a signal input connected to a corresponding CMOS switch driver differential signal output to supply a differential analog current.

16. The circuit of claim 14 further comprising:
an integrated circuit (IC) p-type substrate with a deep n-well, and a p-well isolated from the p-type substrate by the deep n-well and n-well sidewalls; and,
wherein the CMOS switch driver is fabricated on the p-well.

17. A current steering digital-to-analog converter (DAC) switch driver circuit comprising:
a level shifter having an input to accept a first binary logic digital signal and an output to supply a second binary logic digital signal in response to the first binary logic digital signal, where the second binary logic digital signal has a low voltage level equal to (Vlow);
a CMOS switch driver having an input to accept the second binary logic digital signal and an output to supply differential driver signals V+ and V− with the low voltage level (Vlow), in response to the second binary logic digital signal; and,
an NMOS DAC current steering cell having a signal input to accept the differential driver signals, and input connected to a power supply with a voltage equal to (0V), where Vlow>(0V), and an output to supply a differential analog current responsive to the differential driver signals.

18. The circuit of claim 17 further comprising:
a plurality of n level shifters, where n is an integer greater than 1, each level shifter accepting a corresponding bit from an n-bit digital word;
a plurality of n CMOS switch drivers, each CMOS switch driver having a signal input connected to a corresponding level shifter signal output;
a plurality of n NMOS DAC current steering cells, each NMOS DAC current steering cell having a signal input connected to a corresponding CMOS switch driver differential signal output to supply a differential analog current.

19. The circuit of claim 17 further comprising:
an IC p-type substrate with a deep n-well, and a p-well isolated from the p-type substrate by the deep n-well and n-well sidewalls;
wherein the CMOS switch driver is fabricated on the p-well; and,
wherein the level shifter is at least partially fabricated on the p-well.

20. The circuit of claim 2 wherein the DAC current steering cell is an NMOS DAC current steering cell.

21. The circuit of claim 2 wherein (Vlow) is greater than ground (0V).

* * * * *